United States Patent
Lee et al.

(10) Patent No.: US 8,179,355 B2
(45) Date of Patent: May 15, 2012

(54) DISPLAY APPARATUS HAVING A PRE-CHARGING FUNCTION

(75) Inventors: Bong-Jun Lee, Seoul (KR);
Chung-Hun Ha, Seoul (KR);
Jong-Hyuk Lee, Seoul (KR); Shin-Tack Kang, Yongin-si (KR); Yu-Jin Kim, Asan-si (KR); Jin-Suk Seo, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1031 days.

(21) Appl. No.: 11/459,129

(22) Filed: Jul. 21, 2006

(65) Prior Publication Data
US 2007/0183218 A1    Aug. 9, 2007

(30) Foreign Application Priority Data
Feb. 6, 2006  (KR) .................. 10-2006-0011333

(51) Int. Cl.
*G09G 3/36*    (2006.01)
(52) U.S. Cl. ............................................. 345/99
(58) Field of Classification Search .................... 345/94, 345/99, 100; 377/64–81
See application file for complete search history.

(56) References Cited

U.S. PATENT DOCUMENTS

| | | | |
|---|---|---|---|
| 7,173,588 B2 * | 2/2007 | Katagawa et al. | 345/89 |
| 2001/0033336 A1 * | 10/2001 | Kameshima et al. | 348/300 |
| 2004/0217935 A1 * | 11/2004 | Jeon et al. | 345/100 |
| 2004/0257322 A1 * | 12/2004 | Moon | 345/87 |
| 2006/0007215 A1 * | 1/2006 | Tobita et al. | 345/204 |

* cited by examiner

*Primary Examiner* — Amr Awad
*Assistant Examiner* — Dennis Joseph
(74) *Attorney, Agent, or Firm* — H.C. Park & Associates, PLC

(57) ABSTRACT

In a gate driving unit and a display apparatus, a first gate driving circuit is connected to a first end of a plurality of gate lines, a second gate driving circuit is connected to a second end of the gate lines, and they are substantially simultaneously turned on. The first and second gate driving circuits apply a first gate signal having a first pre-charging period and a first active period, which is adjacent to the first pre-charging period, to odd-numbered gate lines and apply a second gate signal having a second pre-charging period and a second active period, which is adjacent to the second pre-charging period, to even-numbered gate lines.

18 Claims, 4 Drawing Sheets

DISPLAY APPARATUS HAVING A PRE-CHARGING FUNCTION

CROSS-REFERENCE TO RELATED APPLICATION

This application claims priority from and the benefit of Korean Patent Application No. 2006-11333, filed on Feb. 6, 2006, which is hereby incorporated by reference for all purposes as if fully set forth herein.

BACKGROUND OF THE INVENTION

1. Field of the Invention

The present invention relates to a gate driving unit and a display apparatus having the gate driving unit. More particularly, the present invention relates to a gate driving unit having a pre-charging function and a display apparatus having the gate driving unit.

2. Discussion of the Background

Generally, a liquid crystal display apparatus includes a liquid crystal display panel to display an image. The liquid crystal display panel includes a lower substrate, an upper substrate facing the lower substrate, and a liquid crystal layer interposed between the lower substrate and the upper substrate.

The liquid crystal display panel further includes gate lines, data lines and pixels connected to the gate lines and the data lines. A gate driving circuit may be formed on the liquid crystal display panel by a thin film process. The typical gate driving circuit sequentially outputs a gate signal to the gate lines.

The gate driving circuit generally includes a shift register having plural stages that are connected one after another. That is, each stage provides a corresponding gate line with the gate signal and controls operations of a previous stage and a next stage.

However, as a liquid crystal display panel increases in size, the gate lines get longer and more pixels are connected to each gate line. In this case, the gate signal applied to the pixels from the gate driving circuit may be delayed. Further, when a delayed gate signal is applied to the previous stage and the next stage, the liquid crystal display apparatus may malfunction because the gate signal from the stages is distorted.

SUMMARY OF THE INVENTION

The present invention provides a gate driving unit having a pre-charging function to prevent gate signal delay.

The present invention also provides a display apparatus having the gate driving unit.

Additional features of the invention will be set forth in the description which follows, and in part will be apparent from the description, or may be learned by practice of the invention.

The present invention discloses a gate driving unit including a first gate driving circuit electrically connected to a first end of a plurality of gate lines and a second gate driving circuit electrically connected to a second end of the gate lines. The second gate driving circuit substantially simultaneously turns on with the first gate driving circuit. The first gate driving circuit applies a first gate signal having a first pre-charging period and a first active period, which is adjacent to the first pre-charging period, to the odd-numbered gate lines. The first gate driving circuit also applies a second gate signal having a second pre-charging period and a second active period, which is adjacent to the second pre-charging period, to the even-numbered gate lines. The second gate driving circuit applies the first gate signal and the second gate signal to the odd-numbered gate lines and the even-numbered gate lines, respectively.

The present invention also discloses a display apparatus including a display panel, a first gate driving circuit, a second gate driving circuit and a data driving circuit. The display panel includes a plurality of gate lines, a plurality of data lines, and a plurality of pixels coupled with the gate lines and the data lines to display an image. The first gate driving circuit is electrically connected to a first end of the gate lines, and the second gate driving circuit is electrically connected to a second end of the gate lines. The second gate driving circuit is substantially simultaneously turned on with the first gate driving circuit. The first gate driving circuit applies a first gate signal having a first pre-charging period and a first active period, which is adjacent to the first pre-charging period, to the odd-numbered gate lines. The first gate driving circuit also applies a second gate signal having a second pre-charging period and a second active period, which is adjacent to the second pre-charging period, to the even-numbered gate lines. The second gate driving circuit applies the first gate signal and the second gate signal to the odd-numbered gate lines and the even-numbered gate lines, respectively. The data driving circuit outputs a first data signal and a second data signal to the data lines during the first active period and the second active period, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
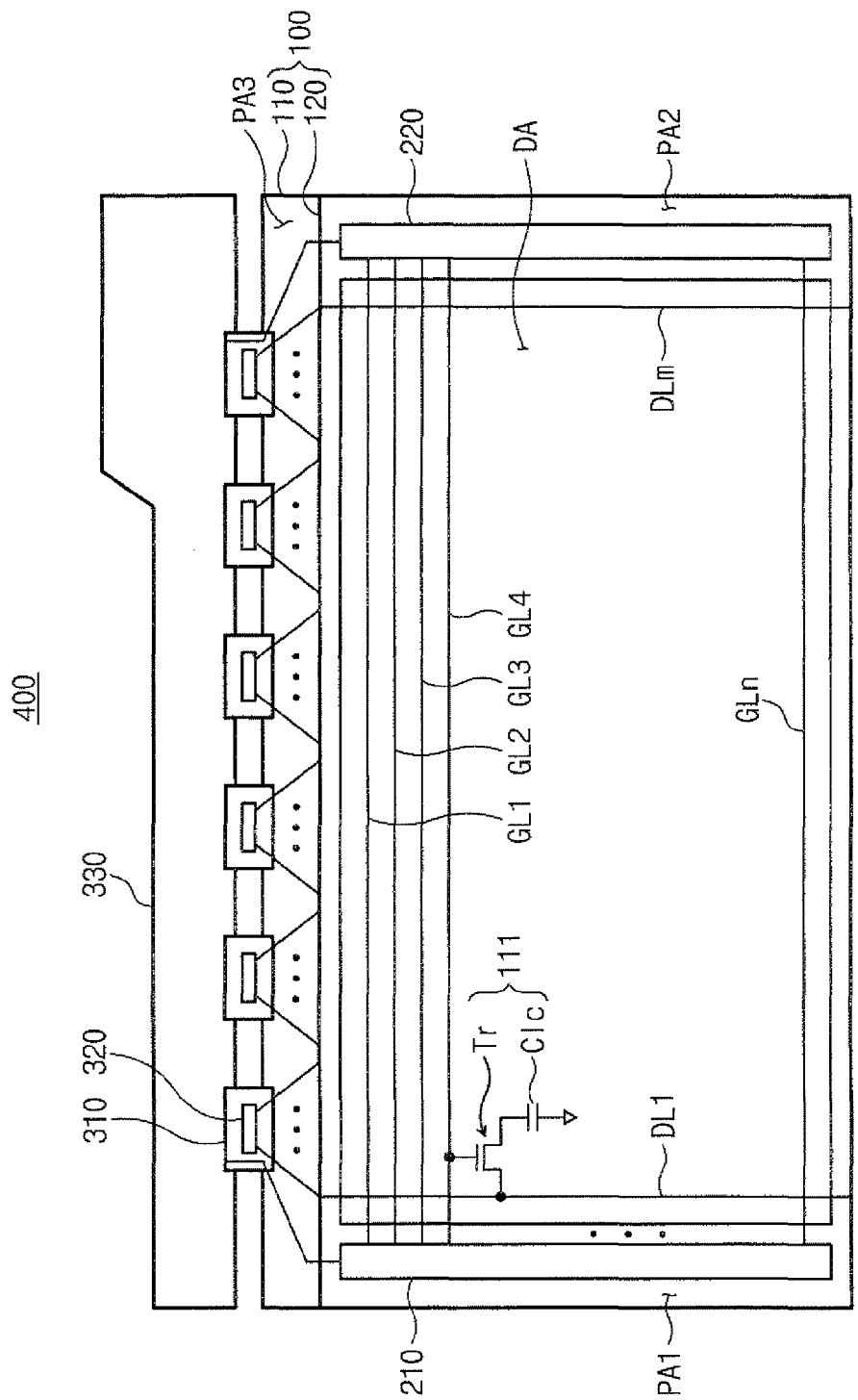
FIG. 1 is a plan view showing a liquid crystal display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element is referred to as being "on", "connected to" or "coupled to" another element, it can be directly on, connected to, or coupled to the other element or intervening elements may be present. In contrast, when an element is referred to as being "directly on," "directly connected to" or "directly coupled to" another element, there are no intervening elements present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to limit the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing a liquid crystal display apparatus according to an exemplary embodiment of the present invention.

Referring to FIG. 1, a liquid crystal display apparatus 400 includes a liquid crystal display panel 100 on which an image is displayed, a plurality of data driving chips 320 that output a data signal to the liquid crystal display panel 100, and first and second gate driving circuits 210 and 220 that output a gate signal to the liquid crystal display panel 100.

The liquid crystal display panel 100 includes a lower substrate 110, an upper substrate 120 facing the lower substrate 110, and a liquid crystal layer (not shown) interposed between the lower substrate 110 and the upper substrate 120. The liquid crystal display panel 100 has a display region DA on which the image is displayed, and first, second and third peripheral regions PA1, PA2 and PA3, which are adjacent to the display region DA.

In the display region DA, a plurality of gate lines GL1~GLn extend in a first direction, and a plurality of data lines DL1~DLm extend in a second direction that crosses with the first direction. The data lines DL1~DLm are insulated from the gate lines GL1~GLn, and together they define a plurality of pixel regions arranged in a matrix configuration. Each pixel region includes a pixel 111 having a thin film transistor Tr and a liquid crystal capacitor Clc. As an example of the present embodiment, the thin film transistor Tr includes a gate electrode electrically connected to a fourth gate line GL4, a source electrode electrically connected to a first data line DL1, and a drain electrode electrically connected to a first electrode of the liquid crystal capacitor Clc.

The first peripheral region PA1 is adjacent to a first end of the gate lines GL1~GLn, and the second peripheral region PA2 is adjacent to a second end of the gate lines GL1~GLn. The first gate driving circuit 210 is arranged in the first peripheral region PA1, and the second gate driving circuit 220 is arranged in the second peripheral region PA2. Hence, the first gate driving circuit 210 is electrically connected to the first end of the gate lines GL1~GLn, and the second gate driving circuit 220 is electrically connected to the second end of the gate lines GL1~GLn.

The first and second gate driving circuits 210 and 220 may be substantially simultaneously turned on to apply the gate signal to the gate lines GL1~GLn through the first and second ends, respectively.

The third peripheral region PA3 is adjacent to a first end of the data lines DL1~DLm. A plurality of tape carrier packages 310 is adhered to the third peripheral region PA3 of the liquid crystal display panel 100, and the data driving chips 320 are mounted on the tape carrier packages 310, respectively. The data driving chips 320 are electrically connected to the first end of the data lines DL1~DLm to apply the data signal to the data lines DL1~DLm.

The liquid crystal display apparatus 400 further includes a printed circuit board 330 to control the first gate driving circuit 210, the second gate driving circuit 220, and the data driving chips 320. Specifically, the printed circuit board 330 outputs a data control signal and image data to control the data driving chips 320, and it outputs a first gate control signal for the first gate driving circuit 210 and a second gate control signal for the second gate driving circuit 220. The data control signal and the image data are applied to the data driving chips 320 through the tape carrier packages 310. The first and second gate control signals are applied to the first and second gate driving circuits 210 and 220, respectively, through the tape carrier packages that are adjacent to the first and second gate driving circuits 210 and 220.

The first and second gate driving circuits 210 and 220 will be described in detail below with reference to FIG. 2 and FIG. 3.

Figure 2:
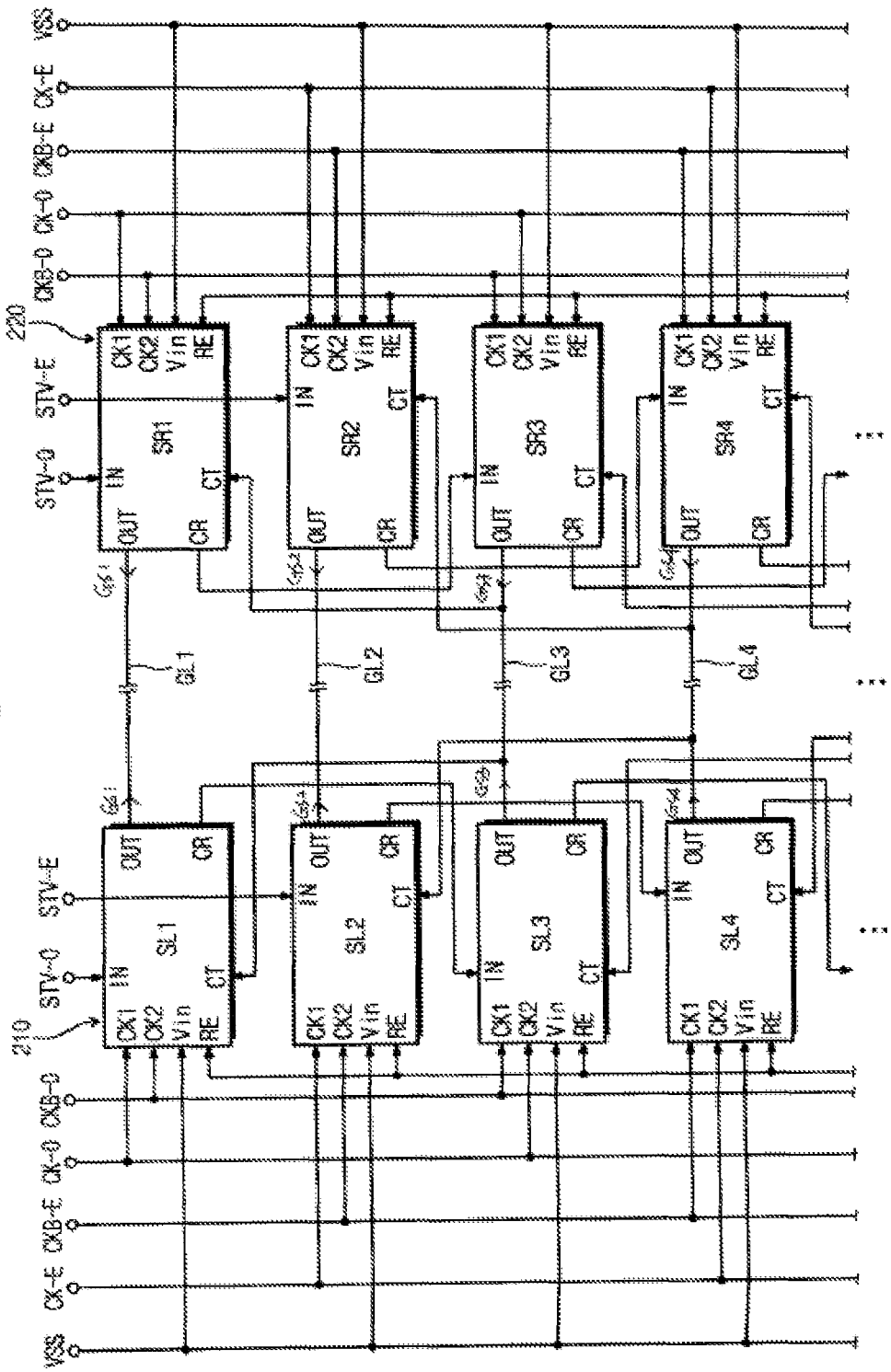
FIG. 2 is a block diagram showing the first and second driving circuits of FIG. 1.
Figure 3:
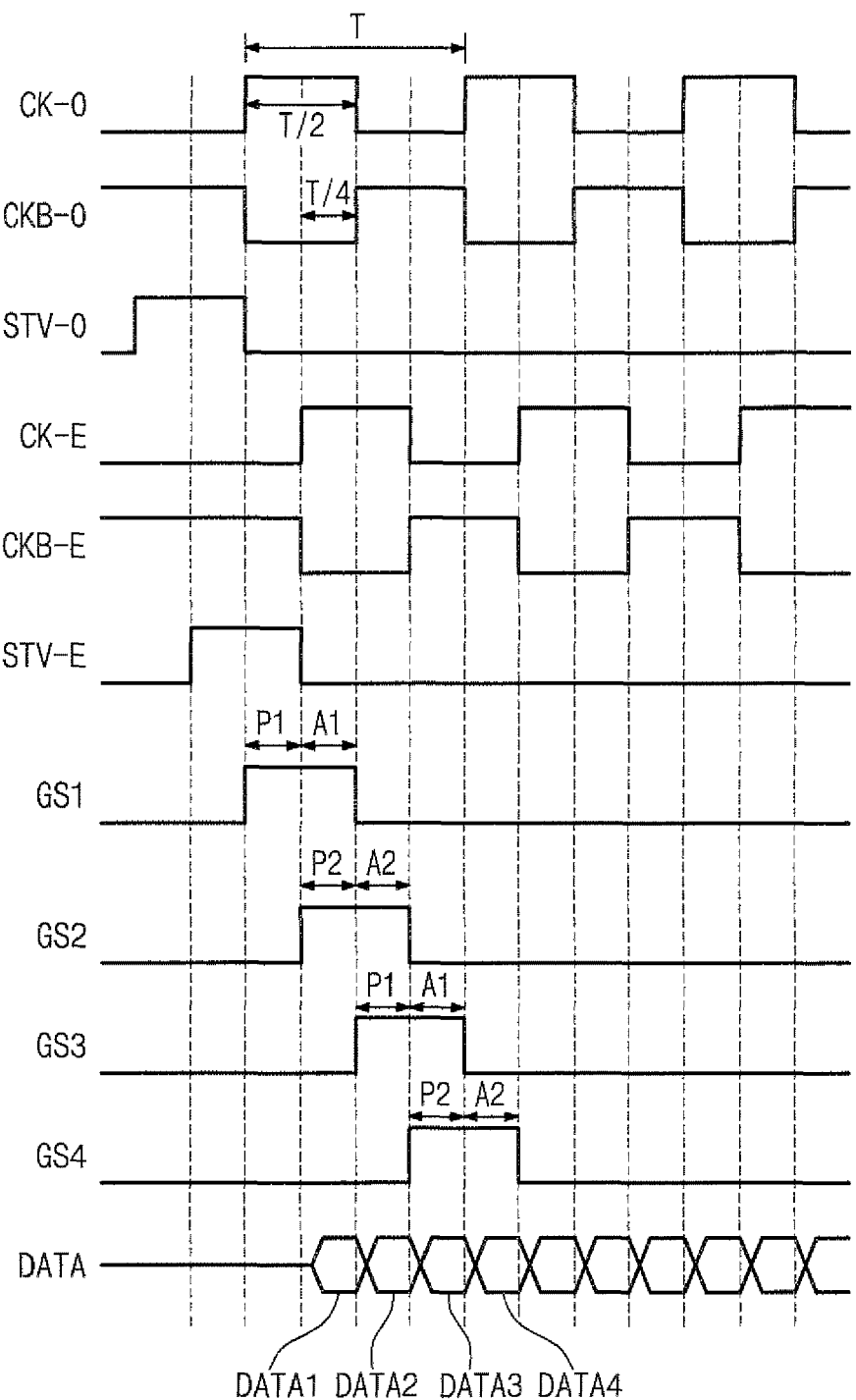
FIG. 3 is a waveform diagram of input/output signals of the first and second gate driving circuits of FIG. 2.

FIG. 2 is a block diagram showing portions of the first and second driving circuits of FIG. 1, and FIG. 3 is a waveform diagram of input/output signals of the first and second gate driving circuits of FIG. 2.

Referring to FIG. 2, the first gate driving circuit 210 is electrically connected to the first end of the first, second, third and fourth gate lines GL1, GL2, GL3 and GL4, and the second gate driving circuit 220 is electrically connected to the second end of the first, second, third and fourth gate lines GL1, GL2, GL3 and GL4.

The first gate driving circuit 210 includes a plurality of left stages SL1, SL2, SL3 and SL4, and the second gate driving circuit 220 includes a plurality of right stages SR1, SR2, SR3 and SR4. In the present exemplary embodiment, odd-numbered left stages SL1 and SL3 are coupled one after another to each other, and even-numbered left stages SL2 and SL4 are also coupled one after another to each other. Likewise, odd-numbered right stages SR1 and SR3 are coupled one after another to each other, and even-numbered right stages SR2 and SR4 are coupled one after another to each other.

Here, the first gate driving circuit 210 has same structure as that of the second gate driving circuit 220. Thus, only the first gate driving circuit 210 will be described in detail below.

Each left stage SL1, SL2, SL3 and SL4 includes an input terminal IN, a first clock terminal CK1, a second clock terminal CK2, a control terminal CT, a voltage input terminal Vin, a reset terminal RE, an output terminal OUT and a carry terminal CR.

As shown in FIG. 2 and FIG. 3, a first start signal STV-O is applied to the first odd-numbered left-stage SL1, and a first odd-numbered clock CK-O, a second odd-numbered clock CKB-O, and a ground voltage VSS are applied to the odd-numbered left stages SL1 and SL3. On the other hand, a second start signal STV-E is applied to the first even-numbered stage SL2, and a first even clock CK-E, a second even clock CKB-E, and the ground voltage VSS are applied to the even-numbered left stages SL2 and SL4.

The first odd-numbered clock CK-O and the second odd-numbered clock CKB-O have opposite phases, and the first even clock CK-E and the second even clock CKB-E have opposite phases. Also, the first even clock CK-E is delayed by about one quarter of one period T (i.e. T/4) of the first odd-numbered clock CK-O, and the second even clock CKB-E is delayed by about one quarter of one period T (i.e. T/4) of the second odd-numbered clock CKB-E.

The first odd-numbered clock CK-O and the second odd-numbered clock CKB-O are applied to a first clock terminal CK1 and a second clock terminal CK2 of the first left stage SL1, respectively. The first even clock CK-E and the second even clock CKB-E are applied to a first clock terminal CK1 and a second clock Terminal CK2 of the second left stage SL2, respectively. The second odd-numbered clock CKB-O and the first odd-numbered clock CK-O are applied to a first clock terminal CK1 and a second clock terminal CK2 of the third left stage SL3, respectively. The second even clock CKB-E and the first even clock CK-E are applied to a first clock terminal CK1 and a second clock terminal CK2 of the fourth left stage SL4, respectively.

The first start signal STV-O and the second start signal STV-E are applied to the input terminal IN of the first left stage SL1 and the input terminal IN of the second left stage SL2, respectively. In the present exemplary embodiment, the second start signal STV-E is delayed by about T/4 from the first start signal STV-O. The input terminal IN of the third left stage SL3 is electrically connected to the carry terminal CR of the first left stage SL1, and the input terminal IN of the fourth left stage SL4 is electrically connected to the carry terminal CR of the second left stage SL2.

The control terminal CT of the first left stage SL1 is electrically connected to the output terminal OUT of the third left stage SL3, and the control terminal CT of the second left stage SL2 is electrically connected to the output terminal OUT of the fourth left stage SL4. Although not shown, the control terminal CT of the third left stage SL3 is electrically connected to an output terminal of a next odd-numbered stage, and the control terminal CT of the fourth left stage SL4 is electrically connected to an output terminal of a next even stage.

The output terminals OUT of the first, second, third and fourth left stages SL1, SL2, SL3 and SL4 are electrically connected to the first, second, third and fourth gate lines GL1, GL2, GL3 and GL4, respectively. Thus, the first, second, third and fourth left stages SL1, SL2, SL3 and SL4 apply first, second, third and fourth gate signals GS1, GS2, GS3 and GS4 to the first, second, third and fourth gate lines GL1, GL2, GL3 and GL4, respectively.

As shown in FIG. 3, the first and third gate signals GS1 and GS3 have a high period including a first pre-charging period P1 and a first active period A1, and the second and fourth gate signals GS2 and GS4 have a high period including a second pre-charging period P2 and a second active period A2. Here, the first, second, third and fourth gate signals GS1, GS2, GS3 and GS4 are maintained in a high state for a period of T/2. The first and second pre-charging periods P1 and P2 correspond to the earlier T/4 period of the high period of the first, second, third and fourth gate signals GS1, GS2, GS3 and GS4, and the first and second active periods A1 and A2 correspond to the later T/4 period of the high period of the first, second, third and fourth gate signals GS1, GS2, GS3 and GS4.

Further, the high period of the second and fourth gate signals GS2 and GS4 is delayed by about a period of T/4 from the high period of the first and third gate signals GS1 and GS3, respectively. Thus, the second pre-charging period P2 of the second gate signal GS2 and the fourth gate signal GS4 correspond to the first active period A1 of the first gate signal GS1 and the third gate signal GS3, respectively.

The data driving chip 320 (see FIG. 1) sequentially outputs a first data signal DATA1, a second data signal DATA2, a third data signal DATA3 and a fourth data signal DATA4. The first data signal DATA1 is applied to the first pixels corresponding to the first gate line GL1 during the first active period A1, the second pixels corresponding to the second gate line GL2 are pre-charged to the first data signal DATA1 during the second pre-charging period P2. The second data signal DATA2 is applied to the second pixels corresponding to the second gate line GL2 during the second active period A2, the third pixels corresponding to the third gate line GL3 are pre-charged to the third data signal DATA3 during the first pre-charging period P1.

Liquid crystal molecules corresponding to the second pixels are pre-tilted by the first data signal DATA1 during the pre-charging period P2, and then the pre-tilted liquid crystal molecules are aligned by the second data signal DATA2 during the second active period A2. Therefore, response time of the liquid crystal may decrease, thereby improving a response speed of the liquid crystal display apparatus.

Thus, the gate signal for the previous stage is partially overlapped with the gate signal for the present stage to pre-charge the pixels corresponding to the gate line of the present stage using the data signal for the previous stage. Consequently, the charging time for the pixels may increase, thereby improving display quality of the liquid crystal display apparatus 400.

Further, the first and second gate driving circuits 210 and 220 are connected to the first and second ends of the gate lines GL1~GL4, respectively, to apply same gate signal to both ends of the gate lines GL1~GL4, thereby preventing gate signal delay and a driving malfunction of the liquid crystal display apparatus 400 due to signal distortion.

Figure 4:
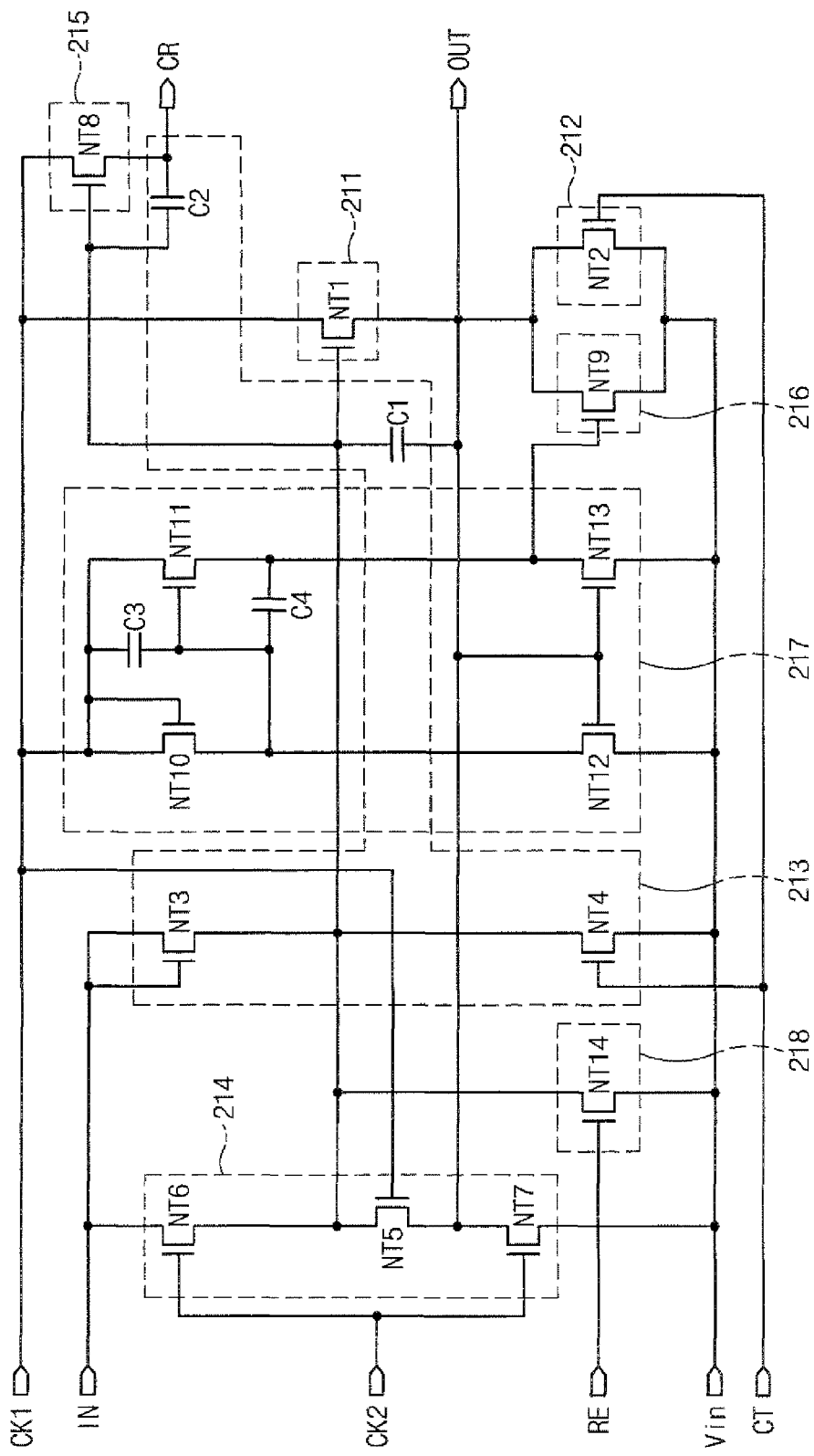
FIG. 4 is a circuit diagram showing a configuration of each stage of FIG. 2.

FIG. 4 is a circuit diagram showing a configuration of each stage of FIG. 2. In the present embodiment, the left stages of the first and second gate driving circuits have the same structure and function as those of the right stages of the first and second gate driving circuits.

Referring to FIG. 4, each stage includes a pull-up part 211, a pull-down part 212, a pull-up driving part 213, a ripple preventing part 214, a carry part 215, a holding part 216, a switching part 217, and a reset part 218.

The pull-up part 211 includes a pull-up transistor NT1 having a control electrode electrically connected to the pull-up driving part 213, an input electrode electrically connected to the first clock terminal CK1, and an output electrode electrically connected to the output terminal OUT. Thus, the pull-up part 211 pulls up the present stage's gate signal that is outputted through the output terminal OUT by the clock applied from the first clock terminal CK1.

The carry part 215 includes a carry transistor NT8 having a control electrode electrically connected to the control electrode of the pull-up transistor NT1, an input electrode electrically connected to the first clock terminal CK1, and an output electrode electrically connected to the carry terminal CR. Therefore, the carry part 215 pulls up the present stage's carry signal that is outputted through the carry terminal CR by the clock.

The pull-down part 212 includes a pull-down transistor NT2 having a control electrode electrically connected to the control terminal CT, an input electrode electrically connected to the output terminal OUT, and an output electrode electrically connected to the voltage input terminal Vin. The pull-down part 212 pulls down the present stage's pulled-up gate signal to ground in response to the next stage's gate signal.

The pull-up driving part 213 includes a buffer transistor NT3, a first capacitor C1, a second capacitor C2, and a discharge transistor NT4. The buffer transistor NT3 has an input electrode and a control electrode that are electrically connected to the input terminal IN and an output electrode electrically connected to the control electrode of the pull-up transistor NT1. The first capacitor C1 is coupled between the control electrode and the output electrode of the pull-up transistor NT1. The second capacitor C2 is coupled between the control electrode and the output electrode of the carry transistor NT8. The discharge transistor NT4 has an input electrode electrically connected to the output electrode of the buffer transistor NT3, a control electrode electrically connected to the control terminal CT, and an output electrode electrically connected to the voltage input terminal Vin. In the present exemplary embodiment, the ground voltage VSS (see FIG. 2) is applied to the voltage input terminal Vin. However, a gate off voltage may be applied to the voltage input terminal Vin.

When the buffer transistor NT3 turns on in response to the previous stage's carry signal, the first and second capacitors C1 and C2 are charged. When the first and second capacitors C1 and C2 are charged over the threshold voltage of the pull-up transistor NT1, the pull-up transistor NT1 and the carry transistor NT8 turn on. Thus, the clock applied to the first clock terminal CK1 is output through the output terminal OUT and the carry terminal CR. After turning on the discharge transistor NT4 in response to the next stage's gate signal, an electric charge charged in the first and second capacitors C1 and C2 is discharged through the discharged transistor NT4 to ground. Thus, the pull-up transistor NT1 and the carry transistor NT8 turn off in response to the next stage's gate signal.

The ripple preventing part 214 includes first, second and third ripple preventing transistors NT5, NT6 and NT7. The first ripple preventing transistor NT5 has a control electrode electrically connected to the first clock terminal CK1, an input electrode electrically connected to the output electrode of the pull-up transistor NT1, and an output electrode electrically connected to the control electrode of the pull-up transistor NT1. The second ripple preventing transistor NT6 has a control electrode electrically connected to the second clock terminal CK2, an input electrode electrically connected to the input terminal IN, and an output electrode electrically connected to the control electrode of the pull-up transistor NT1. The third ripple preventing transistor NT7 has a control electrode electrically connected to the second clock terminal CK2, an input electrode electrically connected to the output electrode of the pull-up transistor NT1, and an output electrode electrically connected to the voltage input terminal Vin.

Responsive to the clock, the first ripple preventing transistor NT5 provides the present stage's gate signal output from the output terminal OUT to the control electrode of the pull-up transistor NT1, thereby preventing ripple of the present stage's gate signal. The second ripple preventing transistor NT6 provides the previous stage's carry signal to the control electrode of the pull-up transistor NT1 in response to the clock bar applied from the second clock terminal CK2, thereby preventing ripple of the present stage gate signal. The third ripple preventing transistor NT7 discharges the present stage's gate signal to ground in response to the clock bar, thereby preventing ripple of the present stage gate signal.

The holding part 216 includes a holding transistor NT9 having a control electrode electrically connected to an output of the switching part 217, an input electrode electrically connected to the output terminal OUT, and an output electrode electrically connected to the voltage input terminal Vin.

The switching part 217 includes first, second, third and fourth switching transistors NT10, NT11, NT12 and NT13, and third and fourth capacitors C3 and C4 to turn the holding transistor NT9 on or off.

The first switching transistor NT10 has an input terminal and a control electrode that are electrically connected to the first clock terminal CK1 and an output electrode electrically connected to the output electrode of the second switching transistor NT11 through the fourth capacitor C4. The second switching transistor NT11 has an input electrode electrically connected to the first clock terminal CK1, a control electrode electrically connected to the input electrode through the third capacitor C3, and an output electrode electrically connected to the control electrode of the holding transistor NT9. The third switching transistor NT12 has an input electrode electrically connected to the output electrode of the first switching transistor NT10, a control electrode electrically connected to the output terminal OUT, and an output electrode electrically connected to the voltage input terminal Vin. The fourth switching transistor NT13 has an input electrode electrically connected to the control electrode of the holding transistor NT9, a control electrode electrically connected to the output terminal OUT, and an output electrode electrically connected to the voltage input terminal Vin.

The first and second switching transistors NT10 and NT11 turn on in response to the clock to output the first clock. The third and fourth switching transistors NT12 and NT13 turn on in response to the present stage's gate signal that is maintained in a high state and output to the output terminal OUT, thereby discharging the clock to ground. Thus, the holding transistor NT9 is maintained in a turned off state. Then, when the present stage's gate signal transitions to the low state, the third and fourth switching transistors NT12 and NT13 turn off, so that the holding transistor NT9 turns on in response to the clock output from the first and second switching transistors NT10 and NT11. Therefore, the holding transistor NT9 may hold the present stage's gate signal at ground.

The reset part 218 includes a reset transistor NT14 having a control electrode electrically connected to a reset terminal RE, an input electrode electrically connected to the control electrode of the pull-up transistor NT1, and an output electrode electrically connected to the voltage input terminal Vin. Responsive to a last carry signal input through the reset terminal RE, the reset transistor NT14 discharges noise input through the input terminal IN to ground. Thus, the pull-up transistor NT1 and the carry transistor NT8 turn on in response to the last carry signal of a last stage. As a result, the last carry signal is applied to the reset terminal RE of N-units previous stages to turn off the pull-up transistor NT1 and the carry transistor NT8 of the N-units previous stages, to thereby reset the gate signal and the carry signal.

According to a gate driving unit and a display apparatus having the same, the first and second gate driving circuits are connected to both ends of the gate lines, respectively, to provide gate signals to the gate lines. Also, the first and second gate driving circuits pre-charge the pixels of the next stage using the first data signal while the pixels of the present stage are charged using the first data signal.

Thus, the gate driving unit may prevent gate signal delay and a driving malfunction of the display apparatus due to signal distortion. Further, since the pixels are pre-charged, the display quality of the display apparatus may improve.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display apparatus, comprising:
   a display panel comprising a plurality of gate lines, a plurality of data lines, and a plurality of pixels coupled with the gate lines and the data lines to display an image;
   a first gate driving circuit electrically connected to first ends of the gate lines, the first gate driving circuit to apply a first gate signal comprising a first pre-charging period and a first active period adjacent to the first pre-charging period to odd-numbered gate lines of the gate lines and to apply a second gate signal comprising a second pre-charging period and a second active period adjacent to the second pre-charging period to even-numbered gate lines of the gate lines;
   a second gate driving circuit electrically connected to second ends of the gate lines, the second gate driving circuit being substantially simultaneously turned on with the first gate driving circuit to apply the first gate signal and the second gate signal to the odd-numbered gate lines and the even-numbered gate lines, respectively; and
   a data driving circuit to output a first data signal and a second data signal to the data lines during the first active period and the second active period, respectively,
   wherein the second pre-charging period of the second gate signal is overlapped with the first active period of the first gate signal,
   wherein the first active period of the first gate signal immediately follows the first pre-charging period of the first gate signal,
   wherein the second active period of the second gate signal immediately follows the second pre-charging period of the second gate signal, and
   wherein a first pixel connected to a first odd-numbered gate line of the odd-numbered gate lines is charged by the first data signal during the first active period, a second pixel connected to a first even-numbered gate line of the even-numbered gate lines, which is adjacent to the first odd-numbered gate line, is pre-charged by the first data signal during the second pre-charging period, and the first pixel and the second pixel are connected to the same data line of the data lines.

2. The display apparatus of claim 1, wherein the second pixel coupled with the first even-numbered gate line is charged by the second data signal during the second active period, and a third pixel coupled with a second odd-numbered gate line of the odd-numbered gate lines, which is adjacent to the first even-numbered gate line, is pre-charged to the second data signal during the first pre-charging period.

3. The display apparatus of claim 2, wherein the first and the second gate driving circuit apply the first gate signal to the first and second odd-numbered gate lines, sequentially.

4. The display apparatus of claim 1, wherein the second gate signal is delayed from the first gate signal by the first pre-charging period.

5. The display apparatus of claim 1, wherein the first gate driving circuit and the second gate driving circuit each comprise:

odd-numbered stages to apply the first gate signal to the odd-numbered gate lines, the odd-numbered stages being coupled together one after another; and
even-numbered stages to apply the second gate signal to the even-numbered gate lines, the even-numbered stages being coupled together one after another.

6. The display apparatus of claim 5, wherein a first odd-numbered stage of the odd-numbered stages operates in response to a first start signal, and a first even-numbered stage of the even-numbered stages operates in response to a second start signal, the second start signal being delayed from the first start signal by the first pre-charging period.

7. The display apparatus of claim 6, wherein the odd-numbered stages receive a first odd-numbered clock and a second odd-numbered clock, the second odd-numbered clock having an opposite phase to that of the first odd-numbered clock, and the even-numbered stages receive a first even-numbered clock and a second even-numbered clock, the second even-numbered clock having an opposite phase to that of the first even-numbered clock.

8. The display apparatus of claim 7, wherein each of the odd-numbered stages comprises:
   an input terminal to receive either the first start signal or a carry signal of a previous odd-numbered stage;
   a first clock terminal to receive either the first odd-numbered clock or the second odd-numbered clock;
   a second clock terminal to receive the odd-numbered clock not received at the first clock terminal;
   an output terminal electrically connected to a corresponding odd-numbered gate line of the odd-numbered gate lines and a control terminal of the previous odd-numbered stage;
   a carry terminal electrically connected to the input terminal of a next odd-numbered stage; and
   a control terminal electrically connected to the output terminal of the next odd-numbered stage.

9. The display apparatus of claim 7, wherein each of the even-numbered stages comprises:
   an input terminal to receive either the second start signal or a carry signal of a previous even-numbered stage;
   a first clock terminal to receive either the first even-numbered clock or the second even-numbered clock;
   a second clock terminal to receive the even-numbered clock not received at the first clock terminal;
   an output terminal electrically connected to a corresponding even-numbered gate line of the even-numbered gate lines and a control terminal of the previous even-numbered stage;
   a carry terminal electrically connected to the input terminal of a next even-numbered stage; and
   a control terminal electrically connected to the output terminal of the next even-numbered stage.

10. The display apparatus of claim 6, wherein the first even-numbered clock and the second even-numbered clock are delayed from the first odd-numbered clock and the second odd-numbered clock, respectively, by the first pre-charging period.

11. The display apparatus of claim 5, wherein the odd-numbered stages receive a first odd-numbered clock and a second odd-numbered clock, the second odd-numbered clock having a different phase from a phase of the first odd-numbered clock, and the even-numbered stages receive a first even-numbered clock and a second even-numbered clock, the second even-numbered clock having a different phase from a phase of the first even-numbered clock.

12. The display apparatus of claim 11, wherein the second odd-numbered clock having an opposite phase from the phase of the first odd-numbered clock, and the second even-numbered clock having an opposite phase to the phase of the first even-numbered clock.

13. The display apparatus of claim 11, wherein each of the odd-numbered stages comprises:
   an input terminal to receive either the first start signal or a signal of a previous odd-numbered stage;
   a first clock terminal to receive either the first odd-numbered clock or the second odd-numbered clock;
   a second clock terminal to receive the odd-numbered clock not received at the first clock terminal; and
   an output terminal electrically connected to a corresponding odd-numbered gate line of the odd-numbered gate lines.

14. The display apparatus of claim 13, wherein the each of the odd-numbered stages further comprises:
   a carry terminal electrically connected to the input terminal of a next odd-numbered stage; and
   a control terminal electrically connected to the output terminal of the next odd-numbered stage, and
   wherein the output terminal is electrically connected to a control terminal of the previous odd-numbered stage.

15. The display apparatus of claim 13, wherein the signal of the previous odd-numbered stage is a carry signal applied in response to the odd-numbered clock not being received at the first clock terminal.

16. The display apparatus of claim 11, wherein the first even-numbered clock and the second even-numbered clock are delayed from the first odd-numbered clock and the second odd-numbered clock, respectively, by the first pre-charging period.

17. The display apparatus of claim 1, wherein the display apparatus comprises a liquid crystal display device.

18. The display apparatus of claim 1, wherein the display apparatus comprises an organic electroluminescent display device.

* * * * *